US008034409B2

(12) United States Patent
Li et al.

(10) Patent No.: US 8,034,409 B2
(45) Date of Patent: Oct. 11, 2011

(54) METHODS, APPARATUSES, AND SYSTEMS FOR FABRICATING THREE DIMENSIONAL INTEGRATED CIRCUITS

(75) Inventors: Shijian Li, San Jose, CA (US); Fritz Redeker, Fremont, CA (US); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 726 days.

(21) Appl. No.: 11/958,025

(22) Filed: Dec. 17, 2007

(65) Prior Publication Data

US 2008/0152464 A1      Jun. 26, 2008

Related U.S. Application Data

(60) Provisional application No. 60/876,407, filed on Dec. 20, 2006.

(51) Int. Cl.
*C23C 16/00* (2006.01)
(52) U.S. Cl. .................. 427/248.1; 438/689; 216/17
(58) Field of Classification Search ............ 216/17; 438/689; 427/248.1
See application file for complete search history.

(56) References Cited

U.S. PATENT DOCUMENTS

| 5,998,292 | A | 12/1999 | Black et al. |
| 6,642,081 | B1 | 11/2003 | Patti |
| 7,091,604 | B2 | 8/2006 | Wylie et al. |
| 7,148,565 | B2 | 12/2006 | Kim et al. |
| 2005/0186791 | A1 * | 8/2005 | Hiatt ............................. 438/667 |
| 2006/0035476 | A1 * | 2/2006 | Staines et al. ................. 438/782 |
| 2006/0223301 | A1 | 10/2006 | Vanhaelemeersch et al. |

FOREIGN PATENT DOCUMENTS

| DE | 10222874 A1 * | 12/2003 |
| JP | 55-143036 A | 11/1980 |
| JP | 10-092738 A | 4/1998 |
| WO | WO 03/015136 A2 | 2/2003 |
| WO | WO 2008/079913 | 7/2008 |

OTHER PUBLICATIONS

U.S. Appl. No. 60/876,407, filed Dec. 20, 2006, Inventors: Shijian Li, et al.

(Continued)

*Primary Examiner* — Roberts Culbert
(74) *Attorney, Agent, or Firm* — Larry Williams

(57) ABSTRACT

The present invention pertains to methods, apparatuses, and systems for fabricating three-dimensional integrated circuits. One embodiment of the method comprises providing a wafer or other substrate having a plurality of through holes. In addition, the method includes supporting the wafer or other substrate with a wafer or other substrate holder mounted in a process chamber. The method further includes generating a pressure differential between the front side of the wafer or other substrate and the back side of the wafer or other substrate while the wafer or other substrate is supported on the wafer or other substrate holder so that the pressure differential causes fluid flow through the through holes. Also, the method includes establishing process conditions in the process chamber for at least one process to fabricate integrated circuits. Embodiments of a system and embodiments of an apparatus according to the present invention are also presented.

30 Claims, 13 Drawing Sheets

OTHER PUBLICATIONS

Three-Dimensional Integrated Circuits: Performance, Design Methodology, and CAD Tools, Shamik Das, et al., *Design Automation Conference 2003, Proceedings of the ASP-DAC*, Asia and South Pacific, Jan. 21-24, 2003, pp. 53-56 (available electronically on Apr. 22, 2003).

The Industrial Physicist: Hidden Imaging Data, Eric J. Lerner, *American Institute of Physics*, pp. 10-13 (Feb./Mar. 2003).

Three-Dimensional Integrated Circuits, A.W. Topol, et al., *IBM Journal of Research and Development*, vol. 50, No. 4/5 (Jul./Sep. 2006).

* cited by examiner

METHODS, APPARATUSES, AND SYSTEMS FOR FABRICATING THREE DIMENSIONAL INTEGRATED CIRCUITS

CROSS REFERENCE

This application claims benefit of U.S. Patent Application Ser. No. 60/876,407, titled "METHODS, APPARATUSES, AND SYSTEMS FOR FABRICATING THREE DIMENSIONAL INTEGRATED CIRCUITS" to Shijian Li, Fritz REDEKER, and Yezdi DORDI, filed Dec. 20, 2006; U.S. Patent Application Ser. No. 60/876,407, filed Dec. 20, 2006, is incorporated herein, in its entirety, by this reference.

BACKGROUND

This invention pertains to three dimensional integrated circuits and apparatuses, methods, and systems for fabricating three-dimensional integrated circuits; more specifically this invention relates to apparatuses, methods, and systems for interconnect metallization of three-dimensional integrated circuits.

A three-dimensional integrated circuit includes two or more semiconductor chips with integrated circuits or includes two or more semiconductor wafers with integrated circuits. The semiconductor chips or semiconductor wafers are stacked together, bonded, and electrically interconnected in three dimensions, i.e., integrated within the semiconductor chips or semiconductor wafers and integrated between the semiconductor chips or semiconductor wafers. The interconnections between the chips or between the wafers are accomplished by way of through holes from the back side to the front side of one or more of the chips or one or more of the semiconductor wafers. In other words, the electrical connections between the stack of chips or stack of wafers are made by way of the through holes. Three-dimensional integrated circuits have a large number of through holes for interconnect metallization between the semiconductor chips or between the semiconductor wafers.

Three-dimensional integrated circuits, according to some designs, will use through holes having diameters of less than 1 micrometer. The length for some of the through holes will be in the range of a few micrometers to 20 or more micrometers. Consequently, the aspect ratios for processing the through holes are extremely high in comparison to standard technologies for fabricating two-dimensional integrated circuits. Typical processes for fabricating two-dimensional integrated circuits cannot easily handle the extremely high aspect ratios that will be required for fabricating three-dimensional integrated circuits. Also, typical processes for fabricating two-dimensional integrated circuits are designed for processing blind holes. Additional process steps are needed to form the through holes successfully.

For the specific example of copper metallization, the requirements for three-dimensional integrated circuits may include deposition of a dielectric layer on the sidewalls of the through hole, deposition of a barrier layer on the dielectric layer, and a copper fill sufficient to allow electrical interconnection of circuits on different chips or wafers in the stack. These requirements coupled with the extreme aspect ratios for three-dimensional integrated circuits make the prospects for successful fabrication of three-dimensional integrated circuits using standard two-dimensional integrated circuit processing technology extremely poor.

Clearly, all of the requirements for fabricating three-dimensional integrated circuits cannot be met using standard two-dimensional integrated circuit fabrication technology. The practical fabrication of three-dimensional integrated circuits will require new processes, apparatuses, and systems capable of meeting the requirements for metallization of three-dimensional integrated circuits. More specifically, there is a need for new processes, apparatuses, and systems capable of meeting the extreme aspect ratio requirements for three-dimensional integrated circuits while providing deposits of materials such as insulators, barrier layers, and metals sufficient in quality for high-performance devices.

SUMMARY

This invention pertains to methods, apparatuses, and systems for fabricating three-dimensional integrated circuits. The present invention seeks to overcome one or more of the deficiencies of the standard technologies for fabricating three-dimensional integrated circuits such as integrated stacks of semiconductor chips or semiconductor wafers with integrated circuits.

One aspect of the present invention is a method of manufacturing three-dimensional integrated circuits. In one embodiment, the method comprises providing a semiconductor wafer having a plurality of through holes. In addition, the method includes supporting the wafer with a wafer holder mounted in a process chamber. The method further includes generating a pressure differential between the front side of the wafer and the back side of the wafer while the wafer is supported on the wafer holder so that the pressure differential causes fluid flow through the through holes. Also, the method includes establishing process conditions in the process chamber for at least one process to fabricate integrated circuits.

Another aspect of the present invention is a system configured to process a semiconductor wafer for three-dimensional integrated circuits. According to one embodiment, the system comprises a process chamber configured to process the wafer at sub-atmospheric pressure. The system also includes a wafer holder configured so as to provide a substantially planar surface to contact the back side of the semiconductor wafer. The wafer holder has a fluid flow channel in fluid communication with the planar surface. The wafer holder is disposed in the process chamber to hold the wafer. The system further includes a vacuum pump connected with the fluid flow channel. The vacuum pump is configured to produce a pressure differential between the front side and back side of the semiconductor wafer.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

Figure 1:
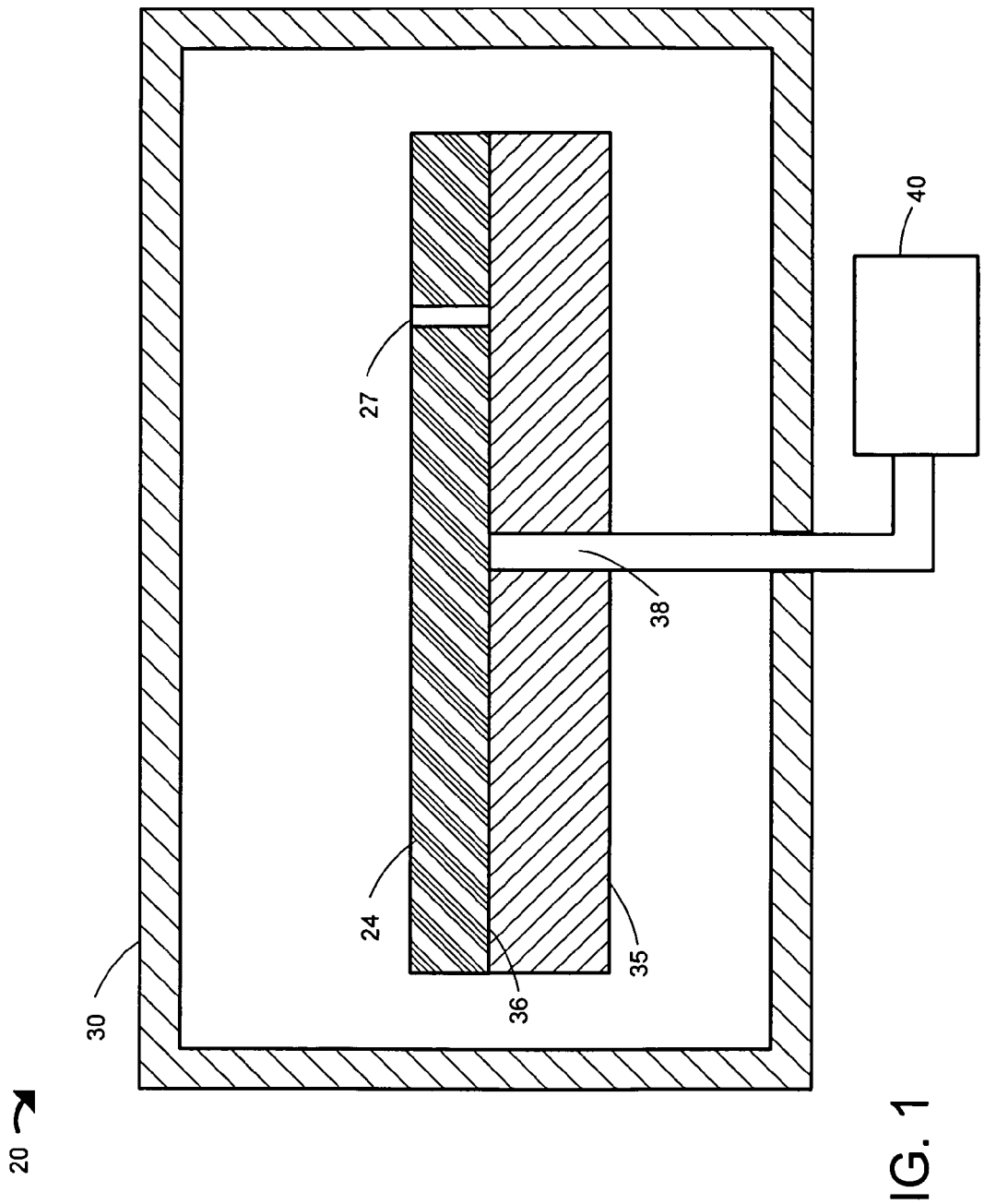
FIG. 1 is a diagram of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to interconnect metallization for three-dimensional integrated circuits. More specifically, the present invention pertains to forming the metallization for metallization lines running through a semiconductor wafer from the front side to the back side of the semiconductor wafer. The metallization is used for the upper level semiconductor wafers used in three-dimensional integrated circuits.

The operation of embodiments of the present invention will be discussed below, primarily, in the context of processing semiconductor wafers for use in stacked wafer three-dimensional integrated circuits. More specifically, the operation of embodiments of the present invention is discussed below in the context of processing silicon wafers for three-dimensional silicon integrated circuits. However, it is to be understood that embodiments in accordance with the present invention may be used for other semiconductor devices and other semiconductor wafers.

In the following description of the figures, identical reference numerals have been used when designating substantially identical elements or steps that are common to the figures.

Figure 1A:
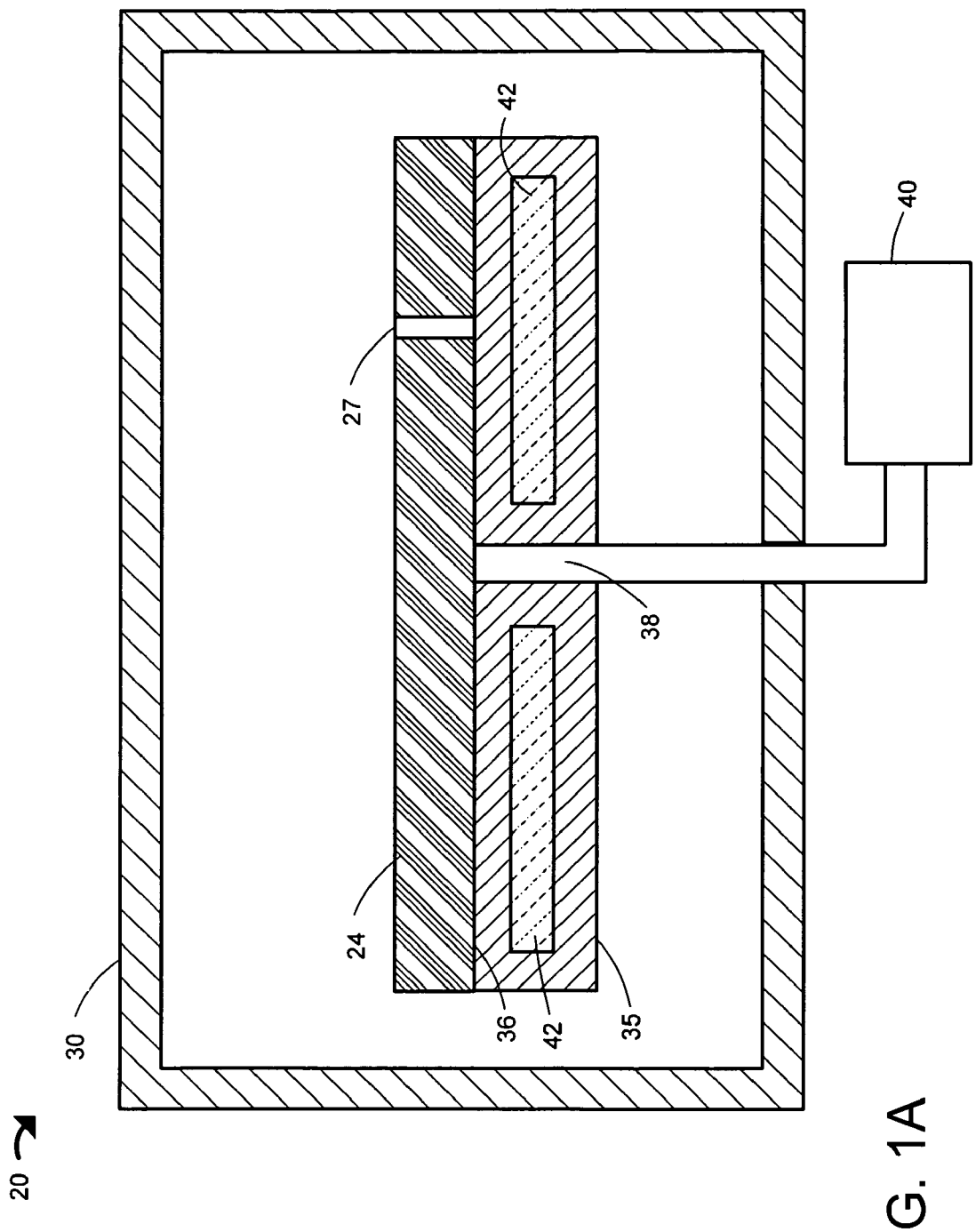
FIG. 1A is a diagram of an embodiment of the present invention.
Figure 1B:
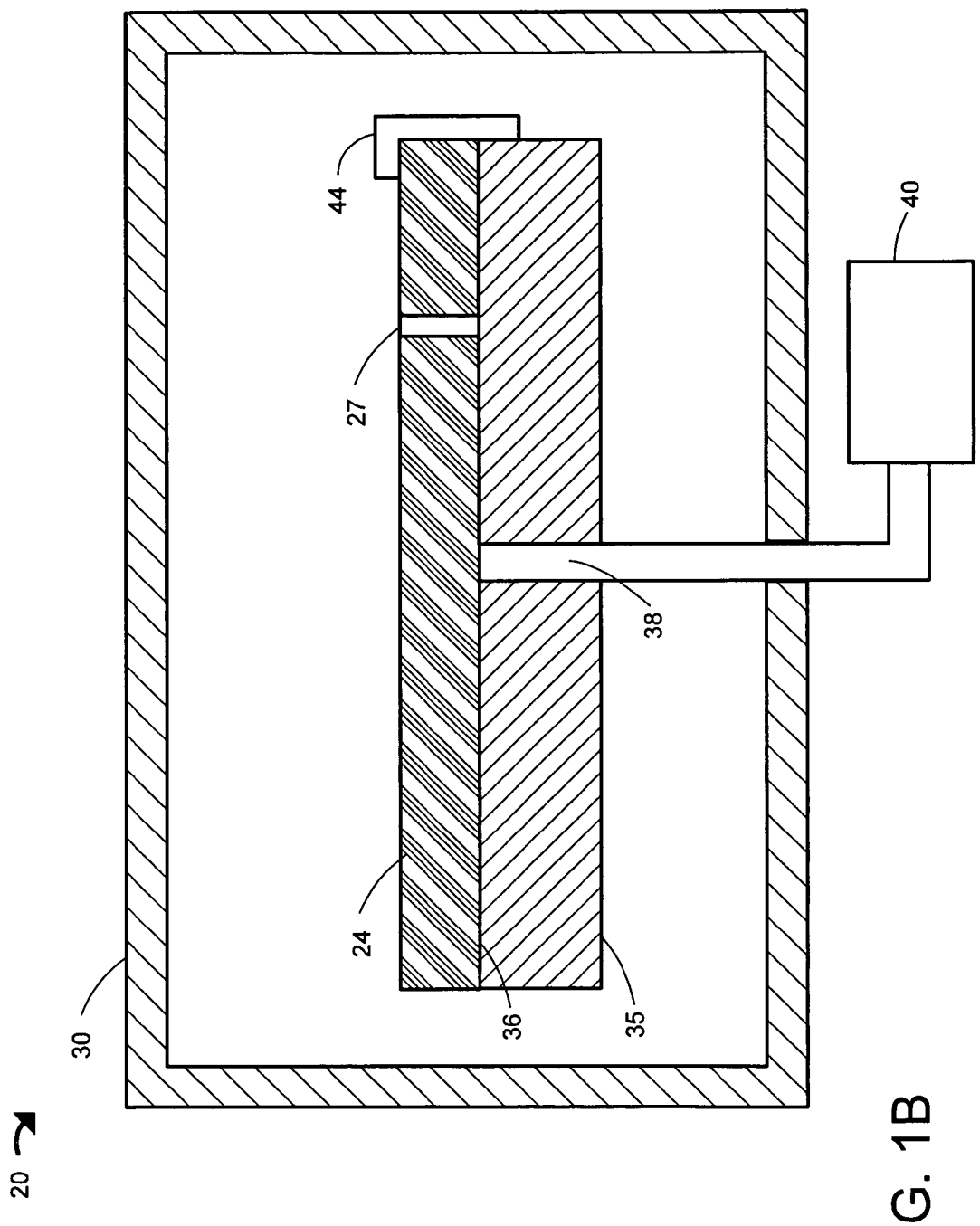
FIG. 1B is a diagram of an embodiment of the present invention.

Reference is now made to FIG. 1, FIG. 1A, and FIG. 1B where there is shown a cross-section side view of a system 20 configured to process a wafer 24 used for fabrication of a three-dimensional integrated circuit. System 20 includes a process chamber 30, a wafer holder 35, and a vacuum pump 40.

Process chamber 30 can be substantially any type of process chamber typically used to process semiconductor wafers for metallization of integrated circuits. Examples of suitable types of process chambers for process chamber 30 are chemical vapor deposition chamber, low-pressure chemical vapor deposition chamber, atmospheric pressure chemical vapor deposition chamber, atomic layer deposition chamber, plasma enhanced chemical vapor deposition chamber, electroless deposition chamber, and electrochemical deposition chamber.

In other words, process chamber 30 is configured to accomplish processes needed for the metallization of wafers used in three-dimensional integrated circuits. Examples of some of the processes that can be accomplished with process chamber 30 are deposition of dielectric material such as silicon dioxide, silicon nitride, silicon carbide, and low k dielectric; deposition of metallic barrier layers such as tantalum, tantalum nitride, and tungsten nitride; deposition of metals such as copper; surface treatments such as surface cleans and surface metal enrichment.

Wafer 24 is configured to be used in a three-dimensional integrated circuit. The typical three-dimensional integrated circuit includes two or more semiconductor chips with integrated circuits or two or more semiconductor wafers with integrated circuits stacked together and electrically interconnected in three dimensions, i.e., integrated within the semiconductor chips or semiconductor wafers and integrated between the semiconductor chips or semiconductor wafers. The interconnections between the chips or between the wafers is accomplished by way of through holes from the back side to the front side of one or more of the chips or one or more of the semiconductor wafers. Wafer 24 has at least one through hole 27 for a metallization interconnect. Wafers used for actual processing of integrated circuits are likely to have a large number of through holes. However, for clarity of illustration, only one through hole is shown in FIG. 1, FIG. 1A, and FIG. 1B.

As an option for some embodiments of the present invention, wafer 24 comprises a semiconductor wafer such as a silicon wafer. As an alternative, other embodiments of the present invention are arranged for processing wafers other than standard semiconductor wafers. Examples of wafers or other substrates for embodiments of the present invention include, but are not limited to, a normal wafer, a thinned wafer, a partial wafer, a thinned partial wafer, a glass substrate, an aluminum oxide substrate, a semiconductor on insulator substrate, an assembly of two or more layers of silicon and/or any other materials, and other substrates used for integrated circuit fabrication.

Wafer holder 35 is configured to hold wafer 24 during processing of wafer 24 in process chamber 30. Wafer holder 35 comprises a substantially rigid body configured so as to provide a substantially planar surface 36 for contacting the back side of semiconductor wafer 24. Wafer holder 35 has a fluid flow channel 38 in fluid communication with planar surface 36. Wafer holder 35 is connected with vacuum pump 40 so that a reduced pressure can be produced at planar surface 36; the reduced pressure is produced via fluid flow channel 38 by vacuum pump 40. The reduced pressure applied at planar surface 36 produces a pressure differential between the front side and back side of semiconductor wafer 24. The pressure differential causes at least a portion of the process fluids provided in process chamber 30 to be drawn from the front side of wafer 24 to the back side of wafer 24 by way of through hole 27 and then on to vacuum pump 40 by way of fluid flow channel 38. Wafer holder 35 shown in FIG. 1 is but one possible design; other configurations for wafer holder 35 are possible that provide greater ease for fluid flow from surface 36 to vacuum pump 40.

Wafer holder 35 should comprise materials that are compatible with integrated circuit manufacturing processes. Preferably, wafer holder 35 is constructed of materials used for other types of semiconductor wafer holders used in process chambers. Examples of suitable materials used for construction of wafer holder 35 are aluminum, anodized aluminum, stainless steel, plastics, and ceramics such as alumina and aluminum nitride. Also, wafer holder 35 may comprise materials such as polyamide and other polymers compatible with semiconductor processes performed in process chamber 30.

Vacuum pump 40 is configured to produce a reduced pressure with respect to the process pressure in process chamber 30. Some examples of types of vacuum pumps that can be used for vacuum pump 40 are mechanical pump, diffusion pump, turbo-molecular pump, cryo pump, and other types of pumps capable of producing a pressure differential. Preferably, vacuum pump 40 is selected so that it is compatible with the processes that occur in process chamber 30. Optionally, vacuum pump 40 may comprise a vacuum system used to produce reduced pressure conditions for the process chamber. The reduced pressure produced by vacuum pump 40 needs to be controlled so that it is sufficiently low with respect to the pressure in the process chamber to enhance fluid flow from the front side of the wafer to the back side of the wafer by way of through hole 27.

The enhanced flow of process fluids from the front side of the wafer to the back side of the wafer by way of through hole 27 allows the side walls of through hole 27 to be more effectively processed. Specifically, the flow of the process fluids into and out of through hole 27 is enhanced by the pressure differential generated by wafer holder 35 and vacuum pump 40 connected together. The enhanced fluid flow improves the effectiveness of the process performed in through hole 27 by allowing more process gas exposure to the walls of through hole 27. The through-the-hole fluid flow that occurs for through hole 27 can achieve better mass transfer than is typically possible for similar processes performed on a blind hole of the same dimensions or even for a through hole on a wafer holder that does not provide substantial flow enhancement for the through hole.

As suggested above, the process fluids used in process chamber 30 may comprise one or more reactive gases or gas mixtures such as reactive gases used to deposit dielectrics, reactive gases used to deposit conductive barrier layers, reactive gases used to deposit metals, reactive gases for surface cleaning, and reactive gases for surface treatment. For some embodiments of the present invention the process fluids include gases maintained at sub-atmospheric pressure for processing wafer 24. As an option, the process fluids used in process chamber 30 may include gases maintained at pressures for vacuum processing semiconductor wafer 24 at pressures less than 1 Torr. Alternatively, the process gases may be maintained at atmospheric pressure or higher than atmospheric pressure for processing wafer 24. The process fluids used in process chamber 30 may comprise one or more liquids or liquid mixtures such as those used to deposit metals by electroless deposition or electrochemical plating. As an option, the process fluids may comprise one or more liquids used to clean semiconductor wafer 24.

Embodiments of the present invention that include process chamber 30 configured to use one or more reactive gases may further comprise an electrode 42 incorporated with wafer holder 35, as shown in FIG. 1A. Electrode 42 is included so that application of electrostatic charge to electrode 42 produces electrostatic forces sufficient to electrostatically clamp wafer 24 in place on wafer holder 35. Electrostatic clamping of wafers for semiconductor wafer processing is frequently used. The configuration for electrode 42 shown in FIG. 1A is but one example; other configurations can be used that may be better suited for the detailed design for wafer holder 35.

As another option for embodiments of the present invention, wafer holder 35 may further comprise a mechanical clamp 44, as shown in FIG. 1B. Mechanical clamp 44 is configured to physically clamp wafer 24 in place on wafer holder 35. Mechanical clamping of wafers for semiconductor wafer processing is frequently used. The configuration for clamp 44 shown in FIG. 1B is but one example; other configurations can be used that may be better suited for the detailed design for wafer holder 35.

Figure 2:
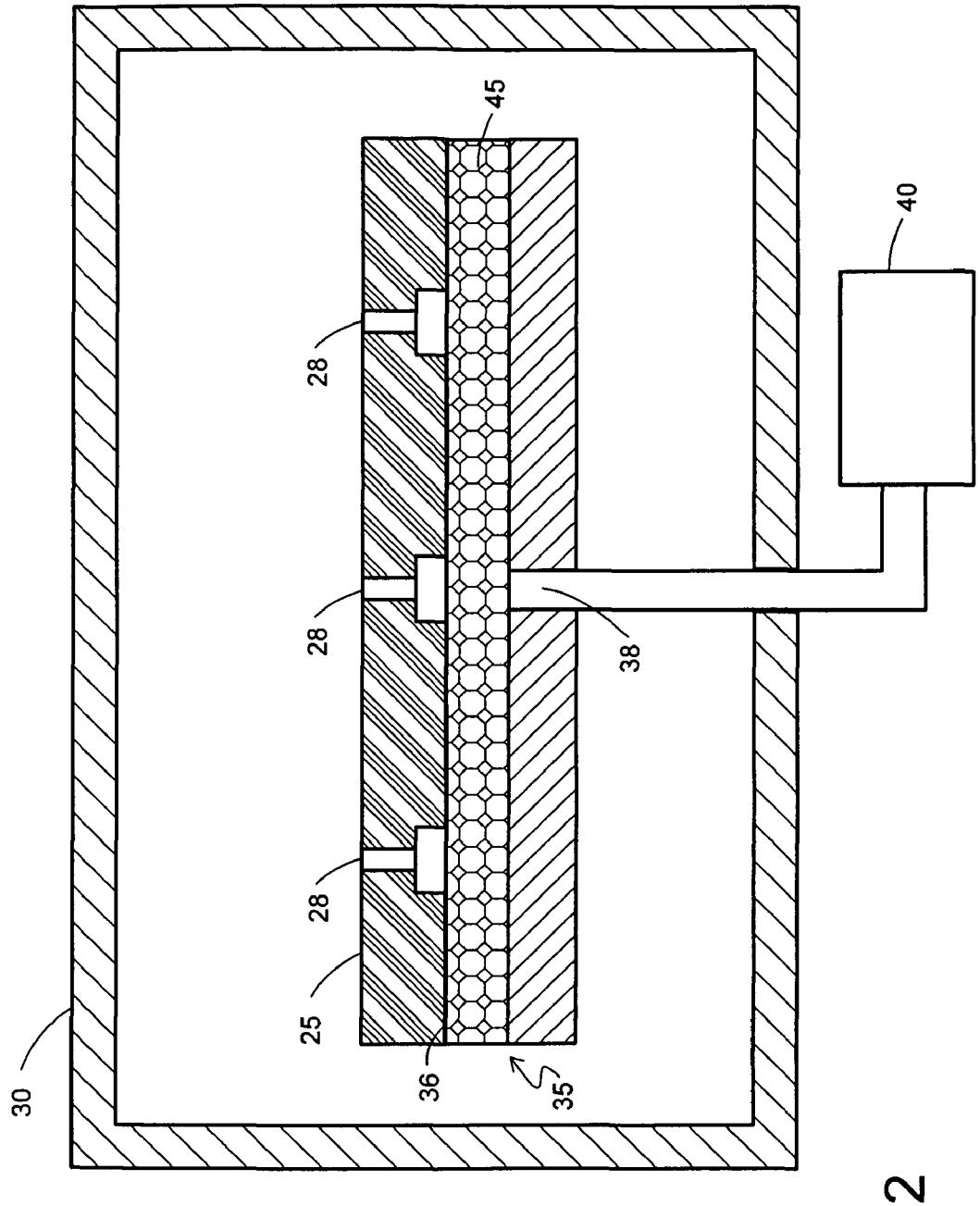
FIG. 2 is a diagram of an embodiment of the present invention.

Reference is now made to FIG. 2 where there is shown a cross-section side view of a system 20 according to one embodiment of the present invention configured to process a semiconductor wafer 25 used for fabrication of a three-dimensional integrated circuit. System 20 includes a process chamber 30, a wafer holder 35, and a vacuum pump 40.

Process chamber 30 can be substantially any type of process chamber typically used to process semiconductor wafers for metallization of integrated circuits. Examples of suitable types of process chambers for process chamber 30 are chemical vapor deposition chambers, low-pressure chemical vapor deposition chambers, atmospheric pressure chemical vapor deposition chambers, atomic layer deposition chambers, plasma enhanced chemical vapor deposition chambers, electroless deposition chambers, and electrochemical deposition chambers.

In other words, process chamber 30 is configured to accomplish processes needed for the metallization of wafers used in three-dimensional integrated circuits. Examples of some of the processes that can be accomplished with process chamber 30 are deposition of dielectric material such as silicon dioxide, silicon nitride, silicon carbide, and low k dielectric; deposition of metallic barrier layers such as tantalum, tantalum nitride, and tungsten nitride; deposition of metals such as copper; surface treatments such as surface cleans and surface metal enrichment.

Wafer 25 is configured to be used in a three-dimensional integrated circuit. The three-dimensional integrated circuit includes two or more semiconductor chips with integrated circuits or two or more semiconductor wafers with integrated circuits stacked and bonded together. The integrated circuits are electrically interconnected in three dimensions. The interconnections between the chips or between the wafers is accomplished by way of through holes from the back side to the front side of one or more of the chips or one or more of the semiconductor wafers. Wafer 25 has at least one counterbore through hole 28 for a metallization interconnect. Counterbore through hole 28 is a standard counterbore where one end of the hole has one diameter and the other end of the hole has a larger diameter. Wafer 25 is configured so that it has counterbore hole 28 with the small diameter end at the front side of the wafer, i.e., the side where the integrated circuits are formed, and the large diameter end of counterbore hole 28 at the back side of the wafer.

The counterbore hole configuration shown for wafer 25 can further enhance the fluid flow for the small diameter portion of counterbore hole 28. The enhanced fluid flow is achieved while maintaining the aspect ratio needed for the through hole metallization interconnect. More specifically, counterbore hole 28, for some embodiments of the present invention, can provide improved processing conditions for the small diameter portion of counterbore hole 28. The large diameter end of counterbore hole 28 is placed at the back side of the wafer; a larger hole in the back side provides better fluid flow at the back side of the wafer. Also by placing the large diameter hole at the back side of the wafer, the larger diameter hole can be easily eliminated so that it is not present in the final three-dimensional integrated circuit. The larger diameter hole is eliminated when the back side of the wafer is partially removed to thin the wafer. The thinned wafer is used in the three-dimensional integrated circuit. Wafers used for actual processing of integrated circuits are likely to have a large number of through holes. However for clarity of illustration, only three through holes are shown in FIG. 2.

Figure 2A:
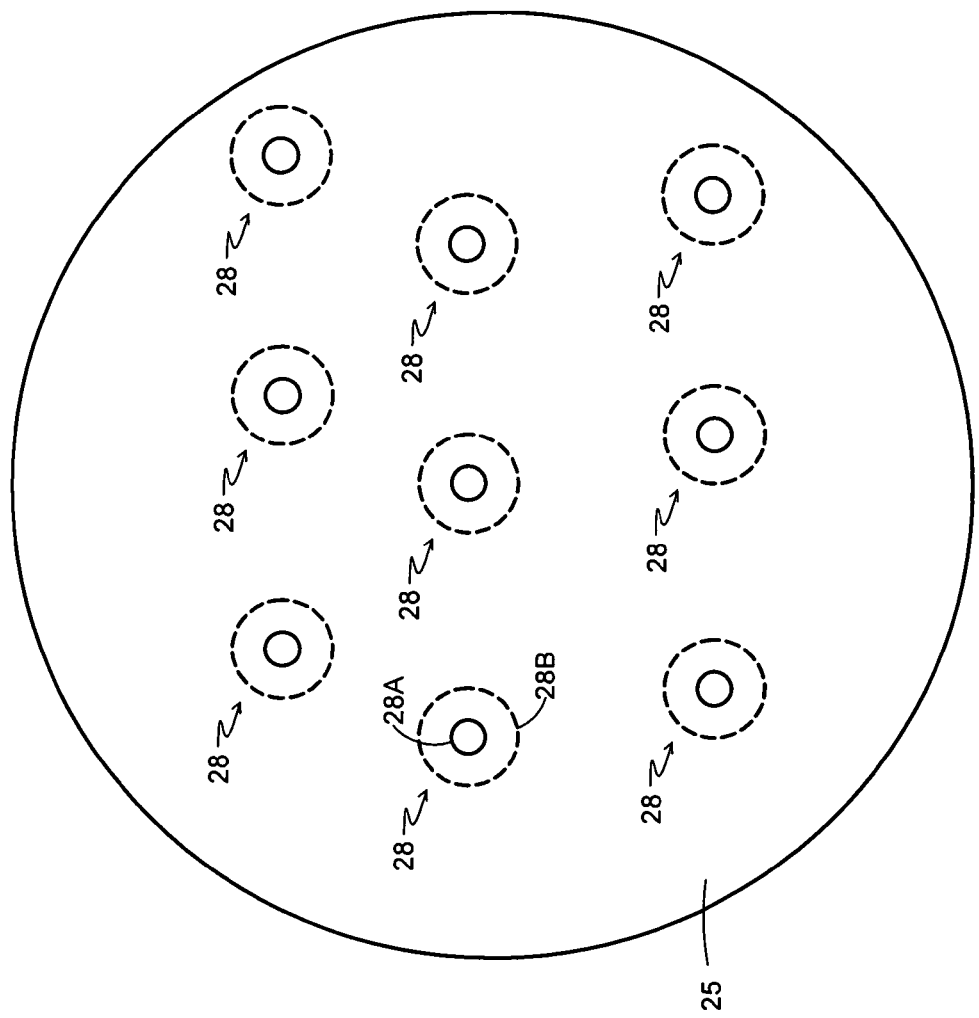
FIG. 2A is a diagram of an embodiment of the present invention.

Wafer 25 is further illustrated in FIG. 2A where there is shown a top view of the front side of wafer 25 according to a preferred embodiment of the present invention. FIG. 2A shows a wafer 25 having a plurality of counterbore holes 28. More specifically, wafer 25 has a plurality of small diameter holes 28A linearly connected with a plurality of larger diameter holes 28B to form the plurality of counterbore holes 28. FIG. 2A shows large diameter holes 28B as dashed lines; large diameter holes 28B are on the back side of the wafer and are hidden in the top view. According to some configurations for wafer 25, small diameter holes 28A may have submicron diameters. The diameter for large diameter holes 28B is preferably selected to be large enough to provide enhanced fluid flow through small diameter holes 28A.

Figure 2B:
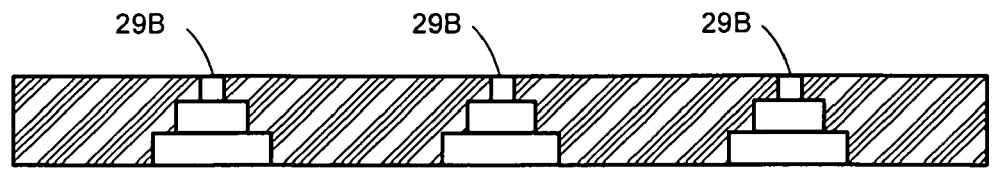
FIG. 2B is a diagram of an embodiment of the present invention.
Figure 2C:
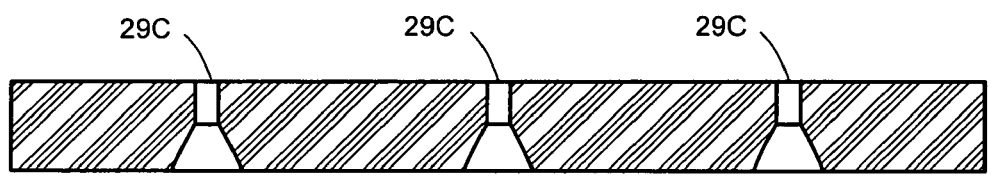
FIG. 2C is a diagram of an embodiment of the present invention.
Figure 2D:
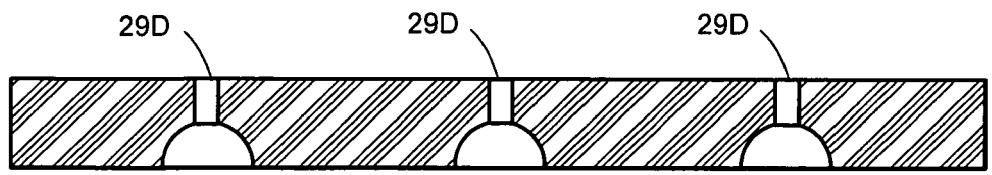
FIG. 2D is a diagram of an embodiment of the present invention.

As an option for some embodiments of the present invention, through holes for the wafer may have more than two diameters so as to form counterbore holes having more than one shoulder. Any practical number of hole diameters can be used for some embodiments of the present invention. FIG. 2B shows a cross-sectioned side view of a wafer 25B having a modified counterbore through hole 29B. Modified counterbore through hole 29B has three diameters for three different sections along the length of the hole so that the modified counterbore hole has two shoulders created by step changes in the diameter of the hole instead of one shoulder for a standard counterbore hole. As another option for some embodiments of the present invention, the through holes may have tapered sidewalls such as to from a cone shape for at least a portion of the length of the hole with a larger opening at the back side of the wafer or other substrate. More specifically, embodiments of the present invention may have countersink holes through the wafer or other substrate. FIG. 2C shows a cross-sectioned side view of a wafer 25C having a countersink through hole 29C. In other embodiments of the present invention, through holes having other shapes may be used such as curved sidewalls. As an option, a hemispherical counterbore through hole having a hemispherical hole portion connecting with a cylindrical hole portion to complete the through hole may be used. FIG. 2D shows a cross-sectioned side view of a wafer 25D having a hemispherical counterbore through hole 29D suitable for some embodiments of the present invention.

As shown in FIG. 2, wafer holder 35 is configured to hold wafer 25 during processing of wafer 25 in process chamber 30. Wafer holder 35 comprises a substantially rigid body that includes a substantially porous material 45. Porous material 45 is configured so as to allow fluid flow through it. Wafer holder 35 is configured so that porous material 45 provides a substantially planar surface 36 for contacting the back side of semiconductor wafer 25. Wafer holder 35 has a fluid flow channel 38 in fluid communication with porous material 45 and consequently in fluid communication with planar surface 36. Wafer holder 35 is connected with vacuum pump 40 so that a reduced pressure can be produced at planar surface 36.

The reduced pressure is produced via fluid flow channel 38 by vacuum pump 40. The reduced pressure applied at planar surface 36 produces a pressure differential between the front side and back side of semiconductor wafer 25. The pressure differential causes at least a portion of the process fluids provided in process chamber 30 to be drawn from the front side of wafer 25 to the back side of wafer 25 by way of counterbore hole 28 and then on to vacuum pump 40 by way of porous material 45 and fluid flow channel 38. Wafer holder 35 shown in FIG. 2 is but one possible design; other configurations for wafer holder 35 are possible that provide alternative fluid flow properties.

Wafer holder 35 should comprise materials that are compatible with integrated circuit manufacturing processes. Preferably, wafer holder 35 is constructed of materials used for other types of semiconductor wafer holders used in process chambers. Examples of suitable materials used for construction of wafer holder 35 are aluminum, anodized aluminum, stainless steel, and ceramics such as alumina and aluminum nitride. Also, wafer holder 35 may comprise materials such as polyamide and other polymers compatible with semiconductor processes performed in process chamber 30.

Vacuum pump 40 is configured to produce a reduced pressure with respect to the process pressure in process chamber 30. Some examples of types of vacuum pumps that can be used for vacuum pump 40 are mechanical pump, diffusion pump, turbo-molecular pump, cryo pump, and other types of pumps capable of producing a pressure differential. Preferably, vacuum pump 40 is selected so that it is compatible with the processes that occur in process chamber 30. Optionally, vacuum pump 40 may comprise a vacuum system used to produce reduced pressure conditions for the process chamber. The reduced pressure produced by vacuum pump 40 needs to be controlled so that it is sufficiently low with respect to the pressure in the process chamber to enhance fluid flow from the front side of the wafer to the back side of the wafer by way of through hole 28.

Figure 3:
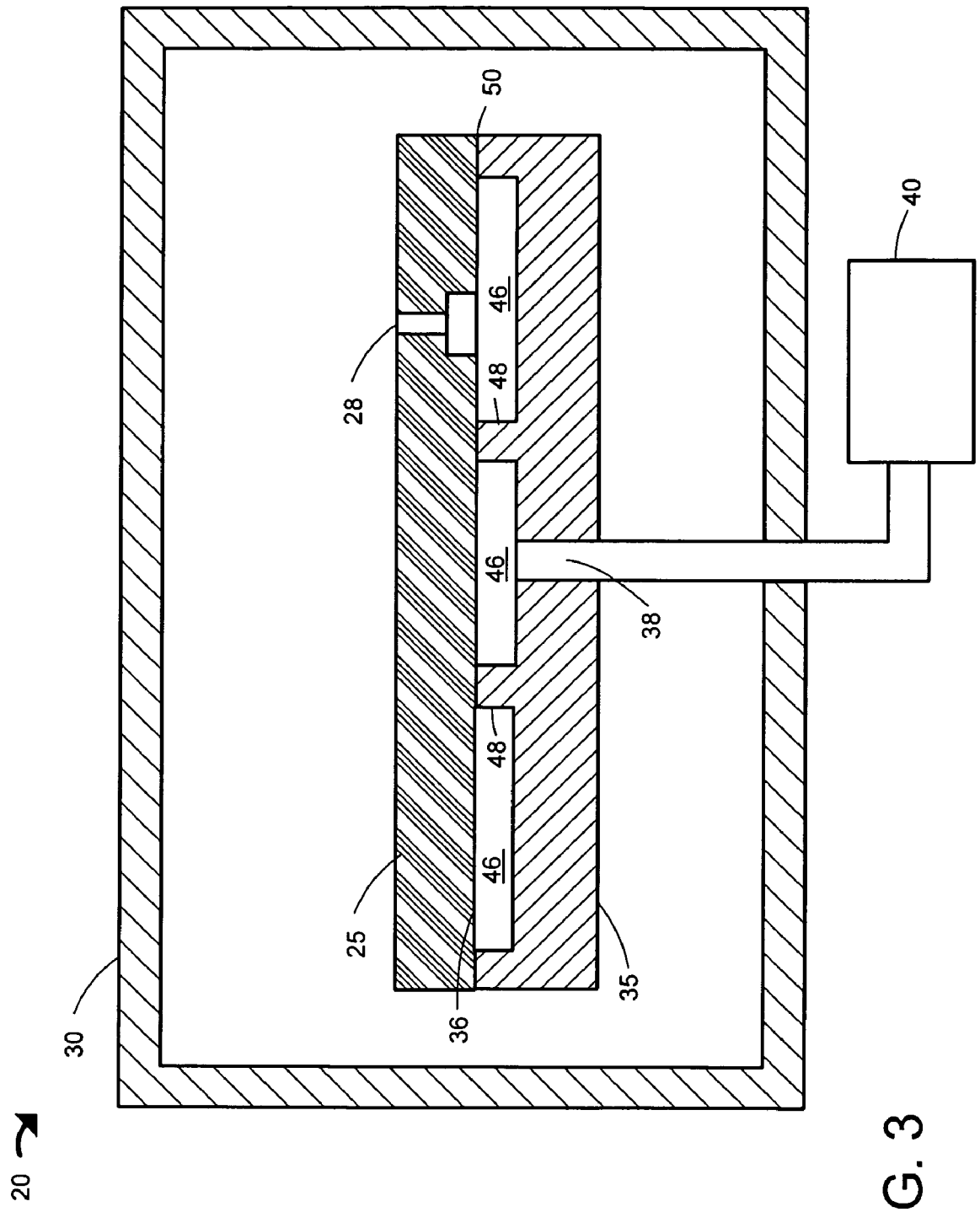
FIG. 3 is a diagram of an embodiment of the present invention.

Reference is now made to FIG. 3 where there is shown a cross-section side view of a system 20 according to one embodiment of the present invention configured to process a semiconductor wafer 25 used for fabrication of a three-dimensional integrated circuit. System 20 includes a process chamber 30, a wafer holder 35, and a vacuum pump 40.

Process chamber 30 can be substantially any type of process chamber typically used to process semiconductor wafers for metallization of integrated circuits. Examples of suitable types of process chambers for process chamber 30 are chemical vapor deposition chamber, low-pressure chemical vapor deposition chamber, atmospheric pressure chemical vapor deposition chamber, atomic layer deposition chamber, plasma enhanced chemical vapor deposition chamber, electroless deposition chamber, and electrochemical deposition chamber.

In other words, process chamber 30 is configured to accomplish processes needed for the metallization of wafers used in three-dimensional integrated circuits. Examples of some of the processes that can be accomplished with process chamber 30 are deposition of dielectric material such as silicon dioxide, silicon nitride, silicon carbide, and low k dielectric; deposition of metallic barrier layers such as tantalum, tantalum nitride, and tungsten nitride; deposition of metals such as copper; surface treatments such as surface cleans and surface metal enrichment.

Wafer 25 is configured to be used in a three-dimensional integrated circuit. The three-dimensional integrated circuit includes two or more semiconductor chips with integrated circuits or two or more semiconductor wafers with integrated circuits stacked and bonded together and electrically interconnected in three dimensions. The interconnections between the chips or between the wafers is accomplished by way of through holes from the back side to the front side of one or more of the chips or one or more of the semiconductor wafers. Wafer 25 has at least one counterbore through hole 28 for a metallization interconnect. Counterbore through hole 28 is a standard counterbore where one end of the hole has one diameter and the other end of the hole has a larger diameter. Wafer 25 is configured so that it has counterbore through hole 28 with the small diameter end at the front side of the wafer, i.e., the side where the integrated circuits are formed, and the large diameter end of counterbore through hole 28 at the back side of the wafer.

The counterbore hole configuration shown in FIG. 3 for wafer 25 can further enhance the fluid flow for the small diameter portion of counterbore through hole 28 while maintaining the aspect ratio needed for the through hole metallization interconnect. More specifically counterbore through hole 28, for some embodiments of the present invention can provide improved processing conditions for the small diameter portion of counterbore through hole 28. The larger diameter portion of counterbore through hole 28 is placed at the back side of the wafer; having the larger diameter portion at the back side of the wafer provides improved fluid flow. Also by placing the larger diameter portion at the back side of the wafer, the larger diameter portion can be easily eliminated from the final three-dimensional integrated circuit as described above. Wafers used for actual processing of integrated circuits are likely to have a large number of through holes. However for clarity of illustration, only one through hole is shown in FIG. 3.

As an option for some embodiments of the present invention, the counterbore structure is not completely removed. Specifically, part of the larger diameter portion of counterbore through hole 28 is substantially filled with metal and incorporated as part of the finished metallization. The larger diameter portion of counterbore through hole 28, when filled with metal, provides a larger target area for making electrical contacts for the through hole metallization. The larger area allows a greater margin of error for electrical contacts with an adjacent wafer in the stack for the three-dimensional integrated circuits. The increased margin of error is expected to produce higher device yields and higher reliability for the three dimensional integrated circuits.

Wafer holder 35 is configured to hold wafer 25 during processing of wafer 25 in process chamber 30. Wafer holder 35 comprises a substantially rigid body configured so as to provide a substantially planar surface 36 for contacting the back side of semiconductor wafer 25. Wafer holder 35 has a fluid flow channel 38 in fluid communication with planar surface 36. Wafer holder 35 has a cavity 46 adjacent to planar surface 36. Wafer holder 35 includes at least one structure 48 disposed in cavity 46. Structure 48 extends from the base of cavity 46 so as to form planar surface 36. Fluid flow channel 38 is in fluid communication with planar surface 36 by way of cavity 46. Wafer holder 35 also includes a surface 50 for contacting the back side periphery of wafer 25. Surface 50 also defines planar surface 36. Preferably, surface 50 is configured to substantially seal the back side periphery of wafer 25 to reduce the amount of fluid flow to vacuum pump 40 that bypasses through hole 28.

Wafer holder 35 is connected with vacuum pump 40 so that a reduced pressure can be produced at planar surface 36; the reduced pressure is produced via fluid flow channel 38 by vacuum pump 40. The reduced pressure applied at planar surface 36 produces a pressure differential between the front side and back side of semiconductor wafer 25. The pressure differential causes at least a portion of the process fluids provided in process chamber 30 to be drawn from the front side of wafer 25 to the back side of wafer 25 by way of through hole 28 and then on to vacuum pump 40 by way of fluid flow channel 38. Wafer holder 35 shown in FIG. 3 is but one possible design; other configurations for wafer holder 35 are possible that provide greater ease for fluid flow from planar surface 36 to vacuum pump 40.

Wafer holder 35 should comprise materials that are compatible with integrated circuit manufacturing processes. Preferably, wafer holder 35 is constructed of materials used for other types of semiconductor wafer holders used in process chambers. Examples of suitable materials used for construction of wafer holder 35 are aluminum, anodized aluminum, stainless steel, and ceramics such as alumina and aluminum nitride. Also, wafer holder 35 may comprise materials such as polyamide and other polymers compatible with semiconductor processes performed in process chamber 30.

Vacuum pump 40 is configured to produce a reduced pressure with respect to the process pressure in process chamber 30. Some examples of types of vacuum pumps that can be used for vacuum pump 40 are mechanical pump, diffusion pump, turbo-molecular pump, cryo pump, and other types of pumps capable of producing a pressure differential. Preferably, vacuum pump 40 is selected so that it is compatible with the processes that occur in process chamber 30. Optionally, vacuum pump 40 may comprise a vacuum system used to produce reduced pressure conditions for the process chamber. The reduced pressure produced by vacuum pump 40 needs to be controlled so that it is sufficiently low with respect to the pressure in the process chamber to enhance fluid flow from the front side of the wafer to the back side of the wafer by way of through hole 28.

As suggested above, the process fluids used in process chamber 30 may comprise one or more reactive gases or gas mixtures such as reactive gases used to deposit dielectrics, reactive gases used to deposit conductive barrier layers, reactive gases used to deposit metals, reactive gases for surface cleaning, and reactive gases for surface treatment. For some embodiments of the present invention the process fluids include gases maintained at sub-atmospheric pressure for processing wafer 25. As an option, the process fluids used in process chamber 38 may include gases maintained at pressures for vacuum processing semiconductor wafer 25 at pressures less than 1 Torr. Alternatively, the process gases may be maintained at atmospheric pressure or higher than atmospheric pressure for processing wafer 25. The process fluids used in process chamber 30 may comprise one or more liquids or liquid mixtures such as those used to deposit metals by electroless deposition or electrochemical plating. As an option, the process fluids may comprise one or more liquids used to clean semiconductor wafer 25.

Figure 4:
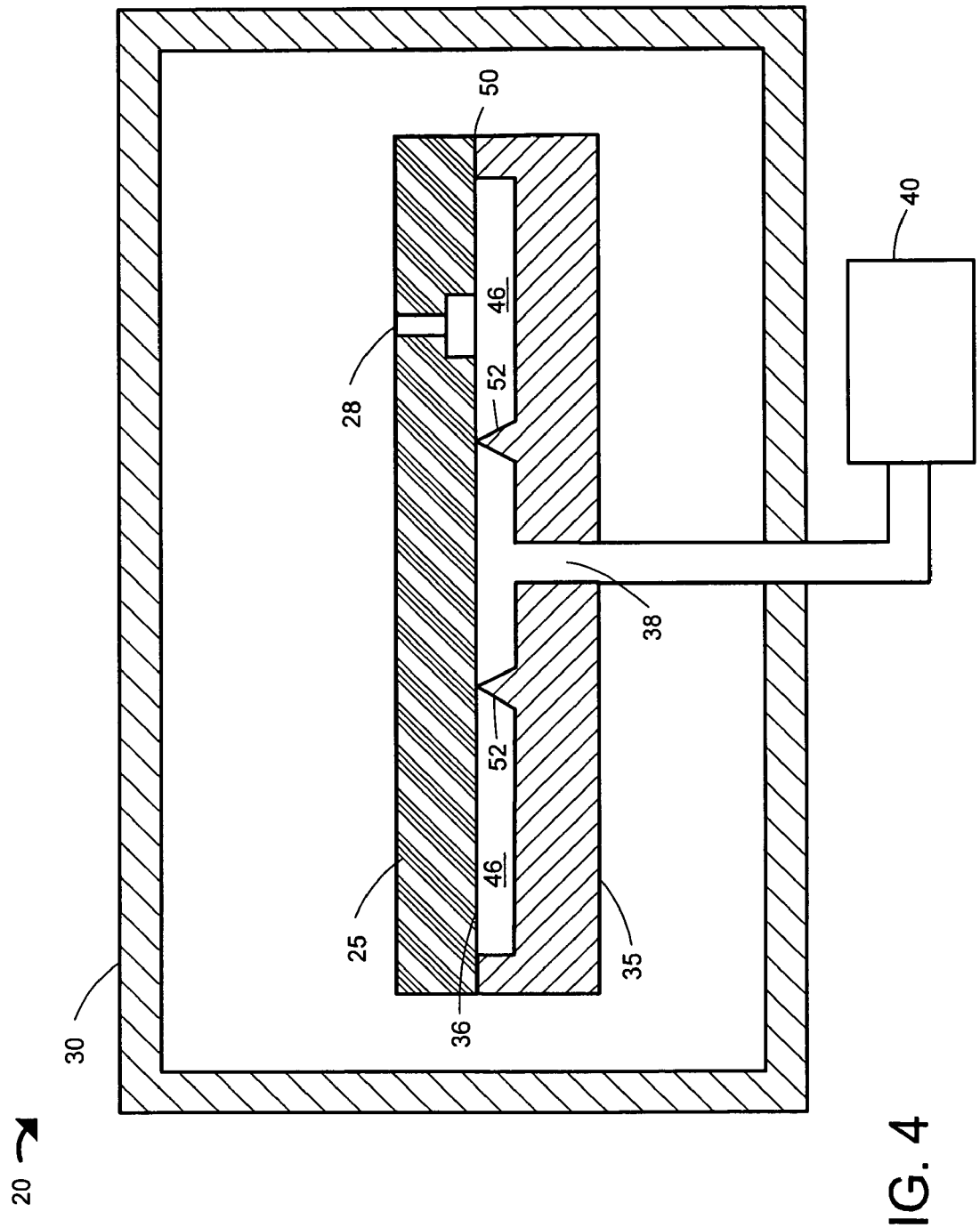
FIG. 4 is a diagram of an embodiment of the present invention.
Figure 4A:
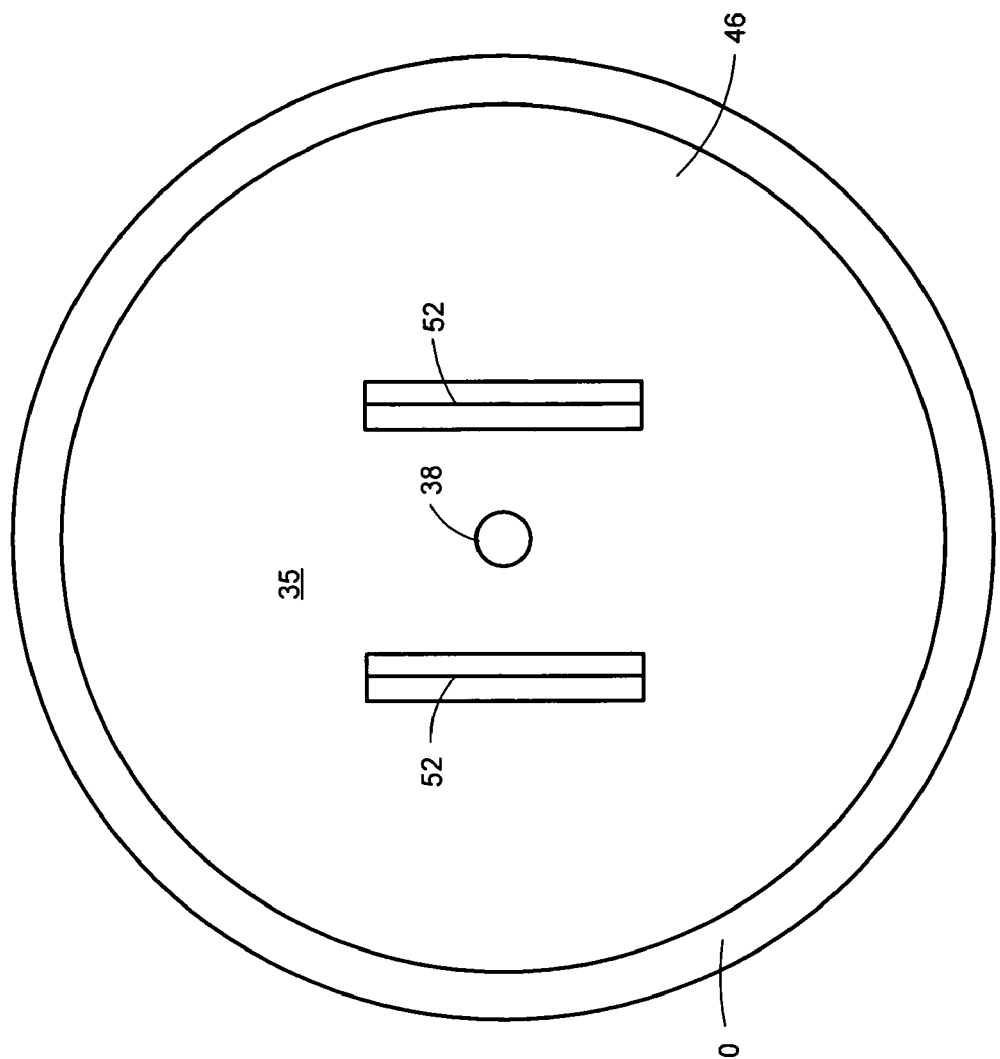
FIG. 4A is a diagram of an embodiment of the present invention.

Reference is now made to FIG. 4 where there is shown a cross-section side view of a system 20 that is essentially the same as the embodiment shown in FIG. 3 and reference is also made to FIG. 4A where there is shown a top view 80 of a wafer holder 35 that is essentially the same as the embodiment shown in FIG. 3. The embodiment shown in FIG. 4 and FIG. 4A uses knife-edge structures 52 instead of structures 48 for the embodiment shown in FIG. 3. The side view of system 20 and top view 80 show wafer holder 35, fluid flow conduit 38, cavity 46, surface 50, and knife-edge structure 52. It is to be understood that the arrangement of knife-edge structure 52 shown in FIG. 4A is but one possibility; other arrangements of knife-edge structure 52 can be used. Preferably, the arrangement of knife-edge structure 52 is designed to provide support for the wafer while minimizing the obstruction of fluid flow through the holes in the wafer.

The standard technology for wafer processing fabricates multiple integrated circuit devices from each wafer. The areas of the wafer containing the integrated circuit devices are sectioned and cut into chips. According to one embodiment of the present invention, the knife edge is designed so that it only contacts the back side of the wafer at locations where there are no holes in the wafer. This can be accomplished, according to one configuration, by arranging the knife edge to contact the back side of the wafer between the areas used for the chips.

Figure 5:
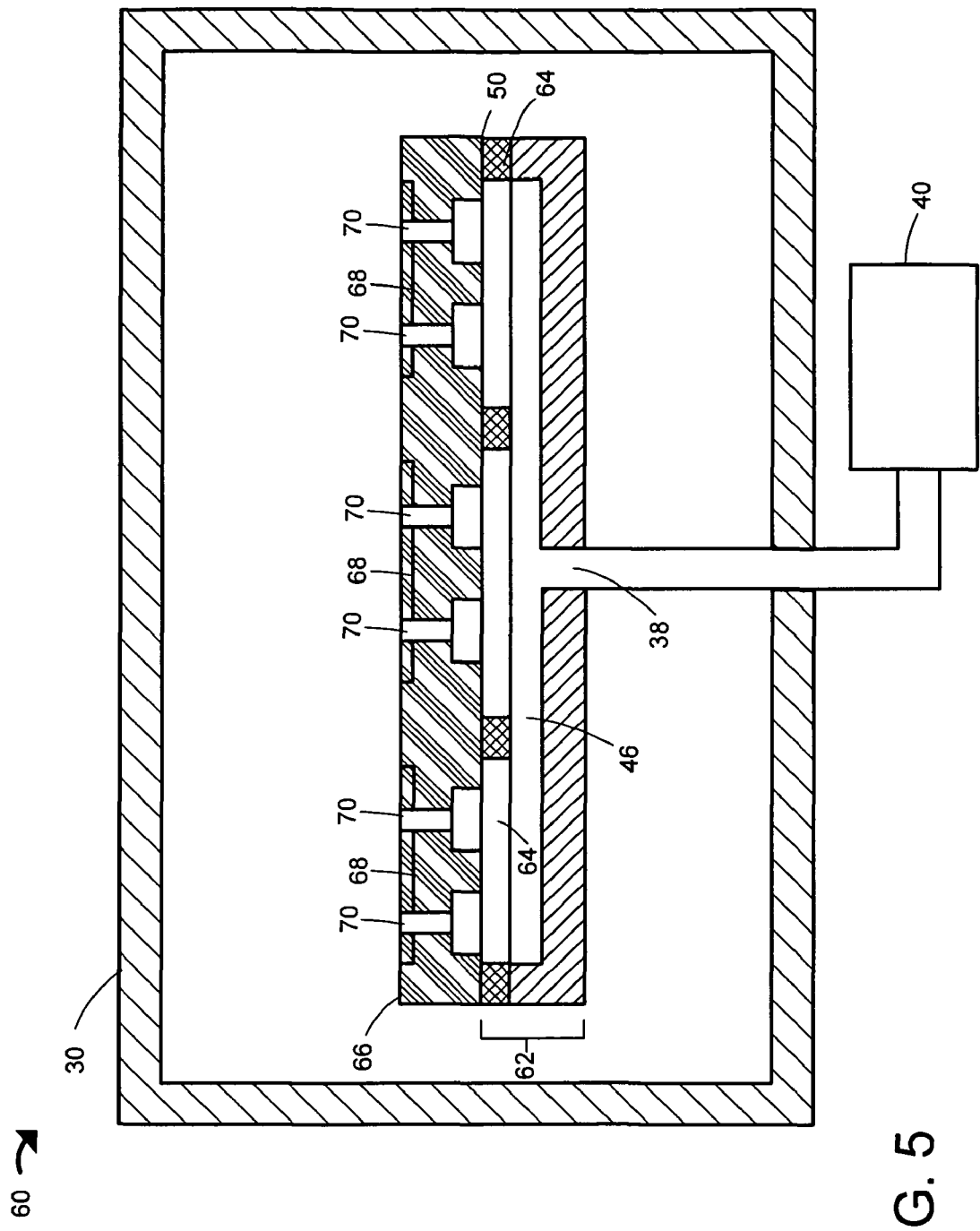
FIG. 5 is a diagram of an embodiment of the present invention.
Figure 5A:
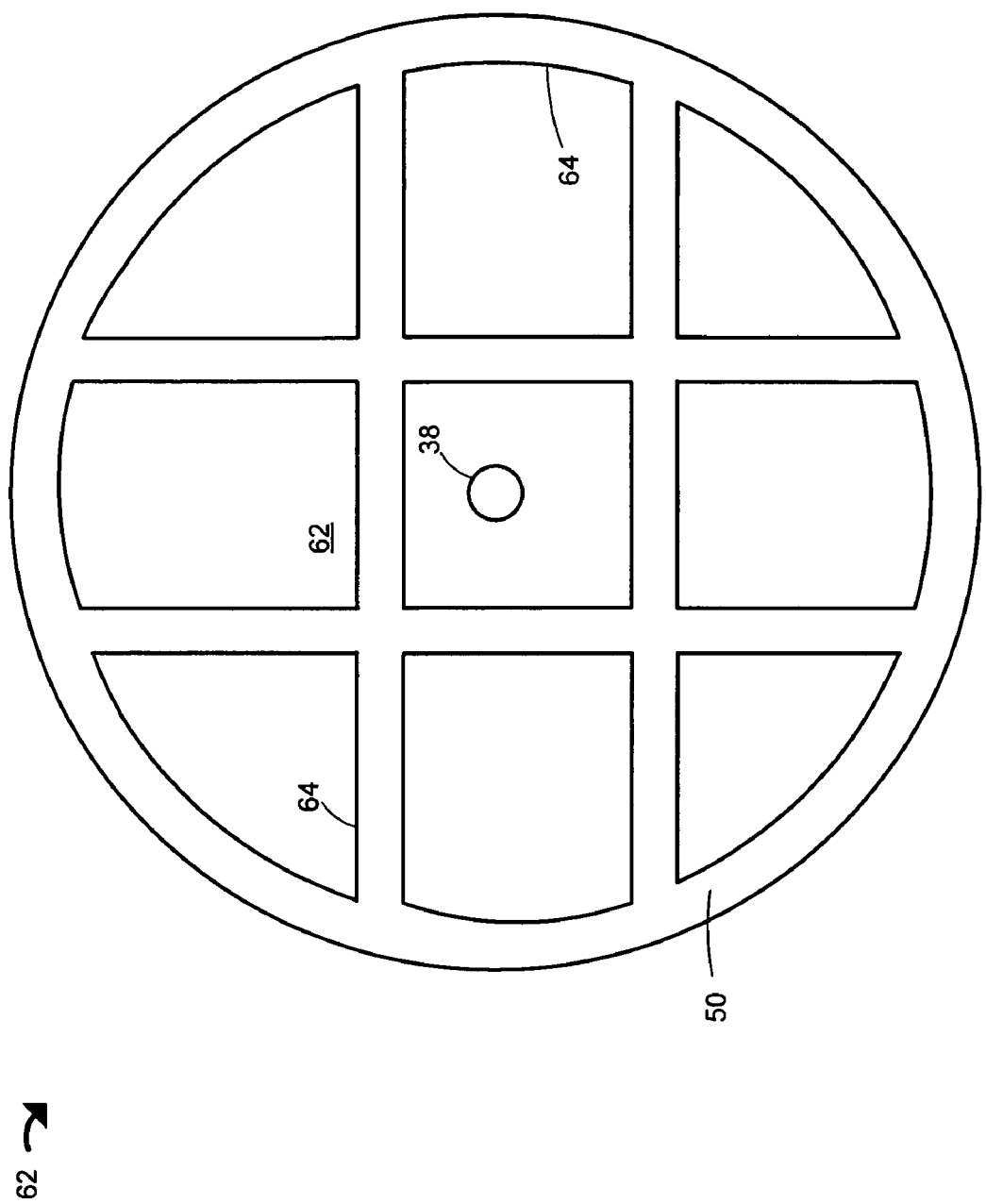
FIG. 5A is a diagram of an embodiment of the present invention.

Reference is now made to FIG. 5 where there is shown a cross-section side view of a system 60 and reference is also made to FIG. 5A where there is shown a top view of a wafer holder 62 included in system 60. For the embodiment shown in FIG. 5 and FIG. 5A, wafer holder 62 includes a pumping plate 64 to support the wafer instead of structures 48 for the embodiment shown in FIG. 3. The side view of system 60 and top view of wafer holder 62 show that wafer holder 62 has a cavity 46 and a fluid flow conduit 38. FIG. 5 also shows a cross-section side view of a wafer 66 for processing in system 60. Wafer 66 is shown with locations for integrated circuit devices 68 and counterbore through holes 70. Pumping plate 64 is also configured with a surface 50 for contacting and substantially sealing the back side periphery of wafer 66, essentially as described for FIG. 3.

Pumping plate 64 is a substantially rigid structure such as a plate comprising a material such as, but not limited to, aluminum, anodized aluminum, stainless steel, ceramic, aluminum oxide, aluminum nitride, silicon carbide, and silicon nitride. Pumping plate 64 has one or more holes at locations corresponding to the locations of areas of the wafer for the integrated circuit devices so that pumping plate 64 does not substantially interfere with the flow of gas through holes 70 in the wafer. As an option, pumping plate 64 may comprise a structure such as a grill, a grating, or a frame having a solid portion and having holes or open portions arranged so that support for wafer 66 is provided by contact with the solid portion. The open portions are positioned to provide substantially unobstructed gas flow through wafer 66. Generally, pumping plate 64 has at least one hole positioned to expose an area of wafer 66 for an integrated circuit device 68. More preferably, pumping plate 64 has a hole for each integrated circuit device 68 (chip) to be fabricated from wafer 66. It is to be understood that the arrangement of pumping plate 64 is but one possibility; other arrangements of pumping plate 64 can be used.

Figure 5B:
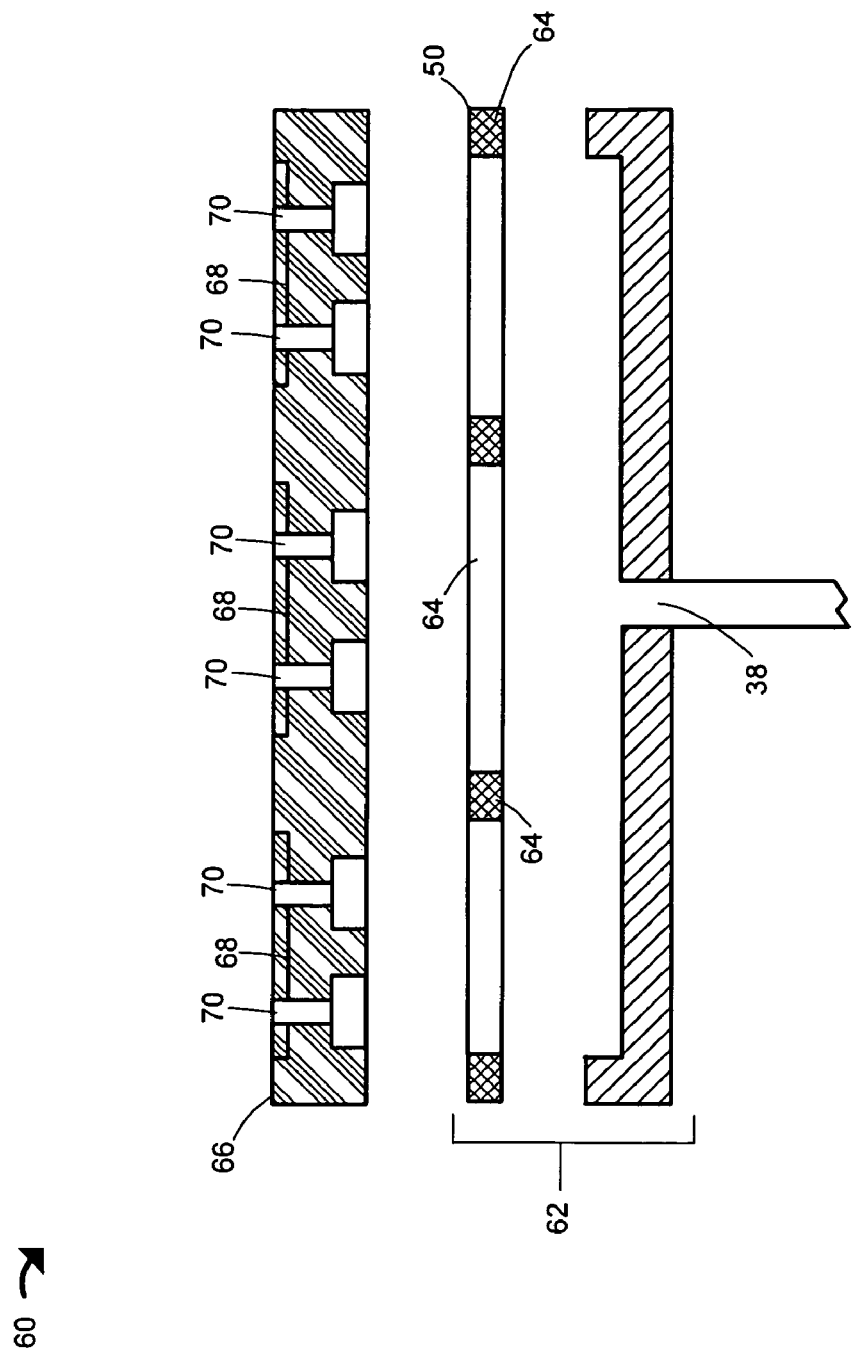
FIG. 5B is a diagram of an embodiment of the present invention.

As an option, pumping plate 64 may be a substantially fixed part of wafer holder 62. Alternatively, pumping plate 64 may be a detachable part of wafer holder 62 so that dissimilar configurations of pumping plate 64 can be interchangeably used in system 60 so as to allow processing wafers for chips having different sizes by providing pumping plate 64 with a compatible hole configuration for the wafers. More specifically for a preferred embodiment, pumping plate 64 is removably coupled to wafer holder 62 to facilitate replacement of pumping plate 64. For illustration of a configuration using a detachable pumping plate 64, FIG. 5B shows an exploded cross section side view of wafer 66 and wafer holder 60.

Another aspect of the present invention is a wafer holder substantially as described above. According to one embodiment, the wafer holder is configured to support a semiconductor wafer in a process chamber for performing a process for fabricating a three-dimensional integrated circuit. The wafer has a plurality of counterbore through holes from the back side of the wafer to the front side of the wafer. The wafer holder comprises a substantially rigid body configured so as to provide a substantially planar surface to contact the back side of the semiconductor wafer. The wafer holder has a fluid flow channel in fluid communication with the planar surface. The wafer holder is configured to connect with a vacuum pump to apply a vacuum to the fluid flow channel to produce a pressure differential between the front side and back side of the semiconductor wafer. The wafer holder is configured to electrostatically clamp the wafer to the wafer holder. The substantially rigid body has a cavity and at least one structure disposed in the cavity. The at least one structure extends from the base of the cavity so as to form the planar surface. The at least one structure has a knife-edge to contact the back side of the wafer so as to reduce or minimize the impedance of gas flow through the wafer. The wafer holder has a surface to form a seal at the back side periphery of the wafer.

Figure 6:
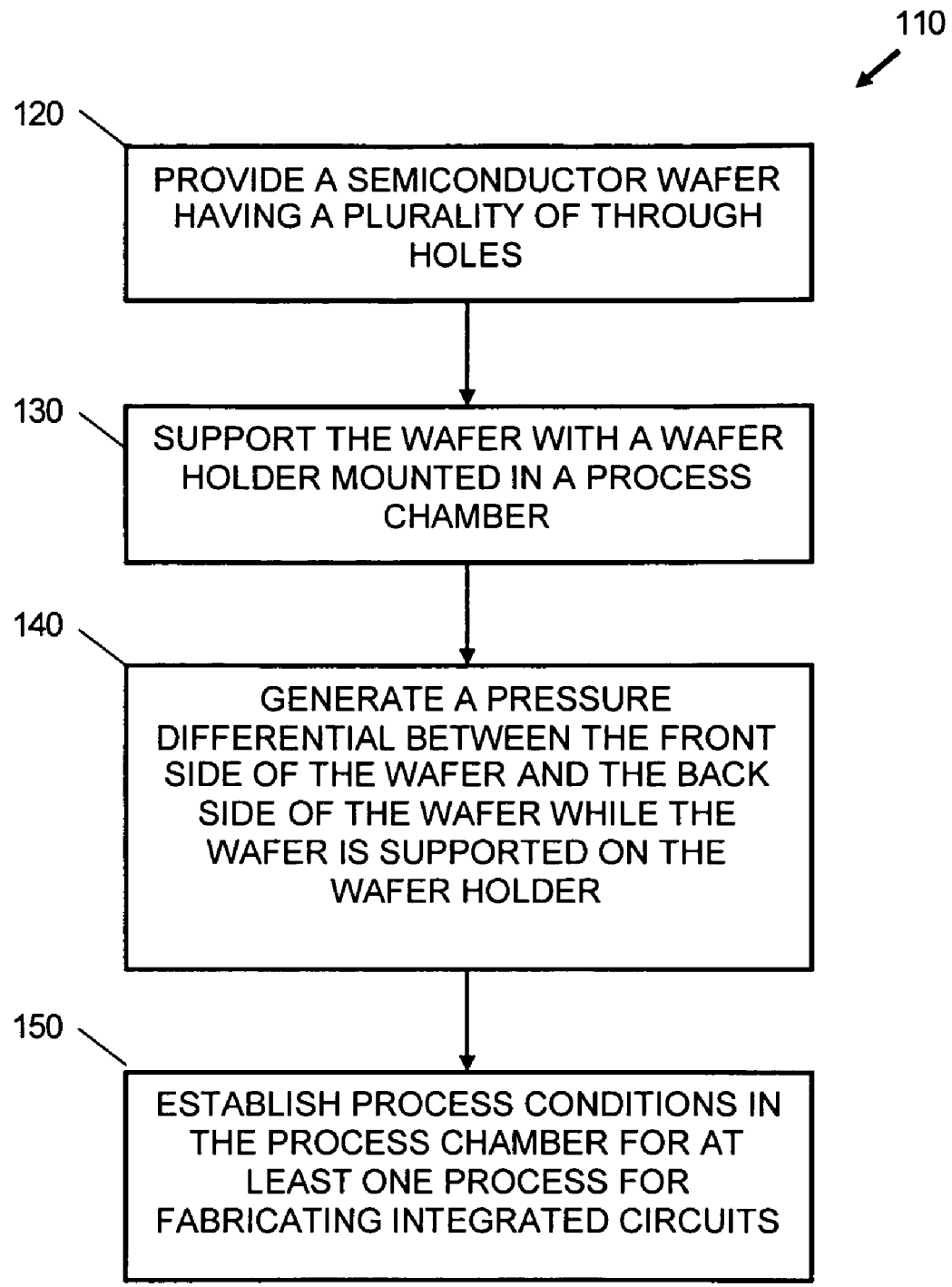
FIG. 6 is a diagram of an embodiment of the present invention.

Still another aspect of the present invention comprises a method of manufacturing three-dimensional integrated circuits. More particularly, the method relates to the fabrication of one or more chips or one or more wafers that are stacked to form three-dimensional integrated circuits. One embodiment of the method will now be described with reference to FIG. 6 where there is shown a process flow 110 according to one embodiment of the present invention. Process flow 110 includes step 120, step 130, step 140, and step 150.

Process flow 110 provides a semiconductor wafer having a plurality of through holes, step 120. The through holes provide a path for metallization lines connecting one of the chips or wafers with an underlying chip or wafer. The requirements for manufacturing advanced integrated circuits usually demand that the through holes to be used for interconnecting chips or wafers have small diameters. As stated above, some devices will require through holes with diameters of less than 1 micrometer. The length for some of the through holes will be in the range of a few micrometers to 20 or more micrometers. Consequently, the aspect ratios for processing the through holes are extremely high in comparison to standard technologies for fabricating two-dimensional integrated circuits. The more extreme aspect ratios that may be required for some three-dimensional integrated circuits may need to be handled with a more preferred embodiment of process flow 110. In this more preferred embodiment, the plurality of through holes in the wafer comprise counterbore through holes. The wafer is configured so that it has counterbore holes with the small diameter end at the front side of the wafer, i.e., the side where the integrated circuits are formed, and the large diameter end of the counterbore hole at the back side of the wafer.

The counterbore hole configuration for the wafer can further enhance the fluid flow for the small diameter portion of the counterbore holes. The enhanced fluid flow is achieved while maintaining the aspect ratio needed for the through hole metallization interconnect. More specifically, the counterbore holes can provide improved processing conditions for the small diameter portion of the counterbore holes. The large diameter end of the counterbore hole is placed at the back side of the wafer; a larger hole in the back side provides better fluid flow at the back side of the wafer. Also by placing the large diameter hole at the back side of the wafer, the larger diameter hole can be easily eliminated from the final three-dimensional integrated circuit. The larger diameter hole is eliminated when the back side of the wafer is partially removed to thin the wafer. The thinned wafer is used in the three-dimensional integrated circuit.

Process flow 110 supports the wafer with a wafer holder mounted in a process chamber, step 130. With the wafer supported on the wafer holder, process flow 110 generates a pressure differential between the front side of the wafer and the back side of the wafer so that the pressure differential causes fluid flow through the through holes, step 140. The reduced pressure is applied to the back side of the wafer using the wafer holder. The reduced pressure is generated by a vacuum pump connected with the wafer holder. Preferably the reduced pressure applied at the back side of the wafer is substantially uniform so that fluid flow through the through holes is substantially uniform. As an option to further improve the reduced pressure applied to the back side of the wafer, process flow 110 may further include formation of a seal between the wafer holder and the back side periphery of the wafer. The formation of the seal can reduce the amount of gas leakage around the edges of the wafer and increase the gas flow through the through holes.

Process flow 110 establishes process conditions in the process chamber for at least one process to fabricate integrated circuits, step 150. In other words, process fluids at the process conditions are forced through the through holes. The fluid flow through the through holes allows the sidewalls of the through holes to be more effectively processed. In other words, the flow of process fluid through the through holes at the established process conditions more effectively processes the sidewalls of the through holes than occurs without the through-the-hole fluid flow. A blind hole or blocked hole would have mass transfer properties inferior to those that occur for embodiments of the present invention.

As indicated above, embodiments of the present invention can be used for a wide variety of processes for metallization of semiconductor devices. Consequently, process flow 110 may include the use of a wide variety of process conditions for metallization in the through holes. As one example, the process conditions used in process flow 110 includes sub-atmospheric pressure process conditions such as vacuum process conditions that use pressures of less than 1 Torr. Optionally, the process conditions may be deposition process conditions or etch process conditions. Some examples of the deposition process conditions for process flow 110 are chemical vapor deposition, low-pressure chemical vapor deposition, and atomic layer deposition. As another option, some embodiments of the present invention may include process conditions for physical vapor deposition.

Process flow 110 may use dry chemical process conditions as just stated or the process conditions may be wet chemical process conditions for wet chemical processes. Some examples of wet chemical processes that can be used as part of process flow 110 are process conditions to accomplish electroless plating and process conditions to accomplish electrochemical plating.

Some specific examples of the types of materials deposited using process conditions established and process flow 110 are electrically insulating layers for integrated circuit manufacturing such as silicon dioxide, silicon carbide, silicon nitride, and low k dielectrics. Alternatively, the process conditions used in process flow 110 may be selected to deposit electrically conducting materials for integrated circuit manufacturing such as copper, tantalum, tantalum nitride, and other materials used for integrated circuit metallization.

Process flow 110 may further include an act to hold the wafer in place on the wafer holder. As an option for some embodiments of the present invention, process flow 110 uses electrostatic forces to electrostatically hold the wafer in place on the wafer holder. The electrostatic forces are generated with the wafer holder. The use of electrostatic forces to hold a wafer in place is a well-known technology and it is in common use for processing two-dimensional integrated circuits. Another option for an embodiment of the present invention includes use of a mechanical clamp to physically hold the wafer to the wafer holder.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. A method of manufacturing three-dimensional integrated circuits, the method comprising:
   providing a wafer having a plurality of through holes;
   supporting the wafer with a wafer holder mounted in a process chamber;
   generating a pressure differential between the front side of the wafer and the back side of the wafer while the wafer is supported on the wafer holder so that the pressure differential causes fluid flow through the through holes; and
   performing chemical vapor deposition, low pressure chemical vapor deposition, atomic layer deposition, low pressure chemical vapor deposition, and/or physical vapor deposition of a dielectric layer and/or a barrier layer on the side walls of the plurality of through holes using the fluid flow.

2. The method of claim 1, wherein the through holes are counterbore holes through the wafer and the large diameter of the counterbore is on the back side of the wafer.

3. The method of claim 1, wherein supporting the wafer with the wafer holder includes electrostatically holding the wafer to the wafer holder.

4. The method of claim 1, wherein supporting the wafer with a wafer holder includes mechanically clamping the wafer to the wafer holder.

5. The method of claim 1, wherein generating the pressure differential uses the wafer holder to generate a reduced pressure at the back side of the wafer.

6. The method of claim 1, wherein generating the pressure differential includes formation of a seal at the back side periphery of the wafer and uses the wafer holder to generate a reduced pressure at the back side of the wafer to cause the fluid flow through the through holes.

7. The method of claim 1, further comprising electroless plating or electrochemical plating on the dielectric layer and/or the barrier layer.

8. The method of claim 1, further comprising depositing copper on the dielectric layer and/or the barrier layer.

9. The method of claim 1, wherein performing chemical vapor deposition, low pressure chemical vapor deposition, atomic layer deposition, low pressure chemical vapor deposition, and/or physical vapor deposition of a dielectric layer and/or a barrier layer on the side walls of the plurality of through holes using the fluid flow includes deposition of a dielectric layer on the sidewalls of the plurality of holes.

10. The method of claim 9, further comprising depositing an electrically conducting layer on the dielectric layer.

11. The method of claim 9, wherein establishing process conditions in the process chamber includes process conditions to deposit tantalum or tantalum nitride on the dielectric layer.

12. The method of claim 9, wherein the dielectric layer comprises silicon dioxide or a low k dielectric.

13. A method of manufacturing three-dimensional integrated circuits, the method comprising:
   providing a wafer having a plurality of through holes;
   supporting the wafer with a wafer holder mounted in a process chamber;
   generating a pressure differential between the front side of the wafer and the back side of the wafer while the wafer is supported on the wafer holder so that the pressure differential causes fluid flow through the through holes; and
   performing chemical vapor deposition, atomic layer deposition, low pressure chemical vapor deposition, and/or physical vapor deposition, in the plurality of through holes using the fluid flow through the through holes.

14. The method of claim 13, wherein performing chemical vapor deposition, atomic layer deposition, low pressure chemical vapor deposition, and/or physical vapor deposition comprises depositing copper.

15. The method of claim 13, wherein performing chemical vapor deposition, atomic layer deposition, low pressure chemical vapor deposition, and/or physical vapor deposition comprises depositing an electrically insulating layer on the sidewalls of the plurality of holes.

16. The method of claim 15, wherein performing chemical vapor deposition, atomic layer deposition, low pressure chemical vapor deposition, and/or physical vapor deposition comprises depositing an electrically conducting layer on the electrically insulating layer.

17. The method of claim 15, wherein performing chemical vapor deposition, atomic layer deposition, low pressure chemical vapor deposition, and/or physical vapor deposition comprises depositing tantalum or tantalum nitride on the electrically insulating layer.

18. The method of claim 15, wherein depositing an electrically insulating layer on the sidewalls of the plurality of holes comprises depositing silicon dioxide or a low k dielectric.

19. A method of manufacturing three-dimensional integrated circuits, the method comprising:
   providing a wafer having a plurality of through holes;
   supporting the wafer with a wafer holder mounted in a process chamber;
   generating a pressure differential between the front side of the wafer and the back side of the wafer while the wafer is supported on the wafer holder so that the pressure differential causes fluid flow through the through holes; and
   at least one of:
      depositing an electrically insulating layer by providing a reactive gas to the process chamber,
      depositing a conductive barrier layer by providing a reactive gas to the process chamber,
      depositing a metal by providing a reactive gas to the process chamber,
      cleaning a surface by providing a reactive gas to the process chamber, and
      treating a surface by providing a reactive gas to the process chamber.

20. The method of claim 19, wherein the through holes are counterbore holes through the wafer and the large diameter of the counterbore holes are on the back side of the wafer.

21. The method of claim 19, wherein generating the pressure differential includes formation of a seal at the back side periphery of the wafer and uses the wafer holder to generate a reduced pressure at the back side of the wafer.

22. The method of claim 19, wherein depositing a metal by providing a reactive gas to the process chamber comprises depositing copper using chemical vapor deposition, low pressure chemical vapor deposition, or atomic layer deposition.

23. The method of claim 19, wherein depositing an electrically insulating layer by providing a reactive gas to the process chamber comprises depositing silicon dioxide or a low k dielectric using chemical vapor deposition, low pressure chemical vapor deposition, or atomic layer deposition.

24. The method of claim 19, wherein depositing an electrically insulating layer by providing a reactive gas to the process chamber comprises depositing an electrically insulating layer on the sidewalls of the plurality of holes.

25. The method of claim 24, wherein depositing a conductive barrier layer by providing a reactive gas to the process chamber comprises depositing an electrically conducting layer on the electrically insulating layer.

26. The method of claim 24, wherein depositing a conductive barrier layer by providing a reactive gas to the process chamber comprises depositing tantalum or tantalum nitride on the electrically insulating layer.

27. A method of manufacturing three-dimensional integrated circuits, the method comprising:
   providing a wafer having a plurality of through holes;
   supporting the wafer with a wafer holder mounted in a process chamber;
   generating a pressure differential between the front side of the wafer and the back side of the wafer while the wafer is supported on the wafer holder so that the pressure differential causes fluid flow through the through holes;
   performing chemical vapor deposition, low pressure chemical vapor deposition, atomic layer deposition, and/or physical vapor deposition of a dielectric layer on the side walls of the plurality of through holes using the fluid flow;

performing chemical vapor deposition, low pressure chemical vapor deposition, atomic layer deposition, and/or physical vapor deposition of a barrier layer on the surface of the dielectric layer using the fluid flow; and performing chemical vapor deposition, atomic layer deposition, low pressure chemical vapor deposition, physical vapor deposition, electroless plating, and/or electrochemical plating a copper fill in the plurality of through holes using the fluid flow capable of electrical interconnection.

28. The method of claim 27 further comprising cleaning the side walls of the plurality of through holes using the fluid flow by providing a reactive gas to the process chamber.

29. The method of claim 27 further comprising cleaning the dielectric layer on the side walls of the plurality of through holes using the fluid flow and/or the barrier layer on the surface of the dielectric layer using the fluid flow by providing a reactive gas to the process chamber.

30. The method of claim 19,
wherein depositing an electrically insulating layer by providing a reactive gas to the process chamber comprises depositing an electrically insulating layer on the sidewalls of the plurality of holes;
wherein depositing a conductive barrier layer by providing a reactive gas to the process chamber comprises depositing an electrically conducting layer on the electrically insulating layer;
wherein depositing a metal by providing a reactive gas to the process chamber comprises depositing copper using chemical vapor deposition, low pressure chemical vapor deposition, or atomic layer deposition; and/or
wherein depositing an electrically insulating layer by providing a reactive gas to the process chamber comprises depositing silicon dioxide or a low k dielectric using chemical vapor deposition, low pressure chemical vapor deposition, or atomic layer deposition.

* * * * *